(12) United States Patent
Bunce et al.

(10) Patent No.: US 8,599,642 B2
(45) Date of Patent: Dec. 3, 2013

(54) PORT ENABLE SIGNAL GENERATION FOR GATING A MEMORY ARRAY DEVICE OUTPUT

(75) Inventors: Paul A. Bunce, Poughkeepsie, NY (US); John D. Davis, Maybrook, NY (US); Diana M. Henderson, Poughkeepsie, NY (US); Jigar J. Vora, Westborough, MA (US)

(73) Assignee: International Business Machines Corporation, Armonk, NY (US)

( * ) Notice: Subject to any disclaimer, the term of this patent is extended or adjusted under 35 U.S.C. 154(b) by 730 days.

(21) Appl. No.: 12/822,021

(22) Filed: Jun. 23, 2010

(65) Prior Publication Data

US 2011/0320851 A1    Dec. 29, 2011

(51) Int. Cl.
*G11C 8/18* (2006.01)
*G06F 1/04* (2006.01)

(52) U.S. Cl.
USPC ..................... 365/233.12; 713/600

(58) Field of Classification Search
USPC ............ 713/500, 600, 601; 365/194, 233.11, 365/233.12, 230.08
See application file for complete search history.

(56) References Cited

U.S. PATENT DOCUMENTS

| | | | |
|---|---|---|---|
| 4,998,221 A | 3/1991 | Correale, Jr. | |
| 5,146,427 A | 9/1992 | Sasaki et al. | |
| 5,376,849 A | 12/1994 | Dickol et al. | |
| 5,450,357 A | 9/1995 | Coffman | |
| 5,612,916 A | 3/1997 | Neduva | |
| 5,623,217 A | 4/1997 | Britton et al. | |
| 5,726,677 A | 3/1998 | Imamura | |
| 5,818,409 A | 10/1998 | Furuhashi et al. | |
| 5,952,859 A | 9/1999 | Kim et al. | |
| 6,061,296 A | 5/2000 | Ternullo, Jr. et al. | |
| 6,084,454 A | 7/2000 | Holst | |
| 6,356,473 B1 | 3/2002 | Shimoyama | |
| 6,377,098 B1 | 4/2002 | Rebeor | |
| 6,384,754 B1 | 5/2002 | Park | |
| 6,510,089 B2 | 1/2003 | Taura et al. | |
| 6,549,452 B1* | 4/2003 | Park | 365/154 |
| 6,959,016 B1* | 10/2005 | Keeth et al. | 370/517 |

(Continued)

FOREIGN PATENT DOCUMENTS

KR  100298181 B1  5/2001
WO  0156084 A1  8/2001

OTHER PUBLICATIONS

IBM TDB Ristard CH; "Programmable Pulse Generator;" IP.com Technical Disclosure; May 1, 1975.

(Continued)

*Primary Examiner* — Khanh Dang
(74) *Attorney, Agent, or Firm* — Cantor Colburn LLP; William A. Kinnaman, Jr.

(57) ABSTRACT

A method of generating a dynamic port enable signal for gating memory array data to an output node includes generating a programmable leading edge clock signal derivation of an input dynamic clock signal; generating a programmable trailing edge clock signal derivation of the input dynamic clock signal, wherein the leading edge clock signal derivation and the trailing edge clock signal derivation are independently programmable with respect to one another; and gating the generated programmable leading and trailing edge clock signal derivations with a static input enable signal so as to generate the port enable signal such that, when inactive, the port enable signal prevents early memory array data from being coupled to the output node.

19 Claims, 5 Drawing Sheets

(56) References Cited

U.S. PATENT DOCUMENTS

| | | |
|---|---|---|
| 7,042,262 B2 | 5/2006 | Tam et al. |
| 7,075,855 B1 * | 7/2006 | Bunce et al. ............. 365/189.15 |
| 7,233,542 B2 | 6/2007 | Bunce et al. |
| 7,246,279 B2 | 7/2007 | Pendurkar |
| 7,363,526 B1 | 4/2008 | Chong et al. |
| 7,425,855 B2 | 9/2008 | Chen et al. |
| 7,443,223 B2 | 10/2008 | Bajkowski et al. |
| 7,463,545 B2 | 12/2008 | Kumala |
| 7,515,482 B2 | 4/2009 | Kim et al. |
| 7,535,776 B1 | 5/2009 | Behrends et al. |
| 7,596,053 B1 | 9/2009 | White et al. |
| 7,668,037 B2 | 2/2010 | Carpenter et al. |
| 7,710,796 B2 | 5/2010 | Cottier et al. |
| 2007/0002619 A1 | 1/2007 | Schoenauer et al. |
| 2008/0029839 A1 | 2/2008 | Hold et al. |
| 2008/0258790 A1 | 10/2008 | Branch et al. |
| 2008/0310246 A1 * | 12/2008 | Joshi et al. ............... 365/230.06 |
| 2009/0059653 A1 | 3/2009 | Luk et al. |
| 2009/0109766 A1 | 4/2009 | Terzioglu et al. |
| 2010/0039872 A1 | 2/2010 | Park et al. |
| 2010/0332685 A1 * | 12/2010 | Pyeon et al. ...................... 710/3 |
| 2011/0317496 A1 * | 12/2011 | Bunce et al. ............. 365/189.05 |
| 2011/0317499 A1 | 12/2011 | Bunce et al. |
| 2011/0317505 A1 | 12/2011 | Bunce et al. |

OTHER PUBLICATIONS

J. Davis et al; "A .6GHZ 64KB Dual-Read Data Cache for the Power6 Processor," IEEE International Solid-State Circuits Conference; 2006.

U.S. Appl. No. 12/822,038; Non-Final Office Action; Date Filed Jun. 23, 2010; Date Mailed: May 15, 2012; pp. 1-11.

IBM; "Level Shifter Incorporated into Address Pre-decode Circuit for SRAMs Employing 2 Voltage Planes;" IP.com Technical Disclosure; Jan. 6, 2009.

Disclosed Anonymously; "A Clocked Single Supply Level Shifter with Buit-In Firewall;" IP.com Technical Disclosure; Feb. 3, 2009.

U.S. Appl. No. 12/822,058; Non-Final Office Action; Date Filed: Jun. 23, 2010; Date Mailed: May 11, 2012; pp. 1-11.

U.S. Appl. No. 12/821,824; Non-Final Office Action; Date Filed: Jun. 23, 2010; Date Mailed: May 11, 2012; pp. 1-9.

* cited by examiner

PORT ENABLE SIGNAL GENERATION FOR GATING A MEMORY ARRAY DEVICE OUTPUT

BACKGROUND

The present invention relates generally to integrated circuit memory devices and, more particularly, to port enable signal generation for gating a memory array device output.

As will be appreciated by those skilled in the art, in a domino Static Random Access Memory (SRAM), the individual cells do not employ sense amplifiers to sense the differential voltage on the bit line pairs coupled to the cross-coupled inverters that store the data. Rather, for a domino SRAM, the local bit line is precharged, discharged, and the discharge is detected. The local bit line, the means to precharge the local bit line, and the detector define a dynamic node of the domino SRAM. An output latch, such as a jam latch or keeper latch is used to capture data output from a domino SRAM. The jam latch temporarily holds the data so that a subsequent device or circuit can read the data.

In order to prevent fast arriving data from the array from being written into the output latch (and corrupting the previous cycle's data), a port enable signal may be generated for controlling a transmission gate coupled between the array output and the output latch. More specifically, the port enable signal is a domino signal that is used as the gate signal for one or more transmission gates in order to gate the array output to the output latch. Since an early array output (for example, from fast read or write through) could corrupt the output latch contents or cause an undesirable power increase (fighting the restore before evaluate), gating with the port enable signal allows subsequent logic using the output latch contents to have an expanded sample time. On the other hand, another way to prevent fast write data from being written to the output latch may be to use a read enable signal to gate off write data. However, gating off write data would still not prevent a fast cell's read data from causing hold time problems (latch corruption or power increase) at the latch.

SUMMARY

In an exemplary embodiment, a method of generating a dynamic port enable signal for gating memory array data to an output node includes generating a programmable leading edge clock signal derivation of an input dynamic clock signal; generating a programmable trailing edge clock signal derivation of the input dynamic clock signal, wherein the leading edge clock signal derivation and the trailing edge clock signal derivation are independently programmable with respect to one another; and gating the generated programmable leading and trailing edge clock signal derivations with a static input enable signal so as to generate the port enable signal such that, when inactive, the port enable signal prevents early memory array data from being coupled to the output node.

In another embodiment, a circuit for generating a dynamic port enable signal for gating memory array data to an output node includes a first dynamic transistor stack, the first dynamic transistor stack having a programmable leading edge clock signal derivation of an input dynamic clock signal, a programmable trailing edge clock signal derivation of the input dynamic clock signal, and a static input enable signal as inputs thereto, wherein the leading edge clock signal derivation and the trailing edge clock signal derivation are independently programmable with respect to one another; the first dynamic transistor stack having an intermediate output node, an inverted value of which defines the dynamic port enable signal, with the dynamic port enable signal being generated by the leading edge clock signal derivation, the trailing edge clock signal derivation and the static input enable signal; wherein the port enable signal, when inactive, prevents early memory array data from being coupled to the output node.

In another embodiment, a memory array output control circuit, includes a transmission gate that selectively couples an array output bit line to an output latch, the transmission gate controlled by a dynamically generated port enable signal; a port enable generation circuit that generates the port enable signal, the port enable generation circuit comprising a first dynamic transistor stack, the first dynamic transistor stack having a programmable leading edge clock signal derivation of an input dynamic clock signal, a programmable trailing edge clock signal derivation of the input dynamic clock signal, and a static input enable signal as inputs thereto, wherein the leading edge clock signal derivation and the trailing edge clock signal derivation are independently programmable with respect to one another; and the first dynamic transistor stack having an intermediate output node, an inverted value of which defines the port enable signal, with the port enable signal being generated by the leading edge clock signal derivation, the trailing edge clock signal derivation and the static input enable signal; wherein the port enable signal, when inactive, prevents early memory array data from the array output bit line from being captured at the output latch.

BRIEF DESCRIPTION OF THE SEVERAL VIEWS OF THE DRAWINGS

Referring to the exemplary drawings wherein like elements are numbered alike.

DETAILED DESCRIPTION

Disclosed herein is a method and apparatus for generating a programmable port enable signal that gates a memory array device output to a latch. The ability to generate a programmable dynamic pulse that works well across all process corners is a significant feature that is desirable for many applications. Briefly stated, the embodiments herein utilize two separate programmable delay blocks to provide independent, dual edge programmability. An additional feature disclosed herein is a chopper device configured within the port enable generation circuit domino stack that reduces the required hold time on a static input signal that is used to gate the port enable signal. Although a more conventional chopper could be used to generate the entire port enable pulse, such an approach would only utilize the leading edge of the input clock pulse, and thus the resulting port enable signal would not track the clock pulse as the pulse expands or shrinks with variations in process, temperature, and power supplies. As will be set forth in further detail below, the dual edge programmable port enable signal generated by the techniques disclosed herein prevents fast data from the array from being written into the output latch.

Figure 1:
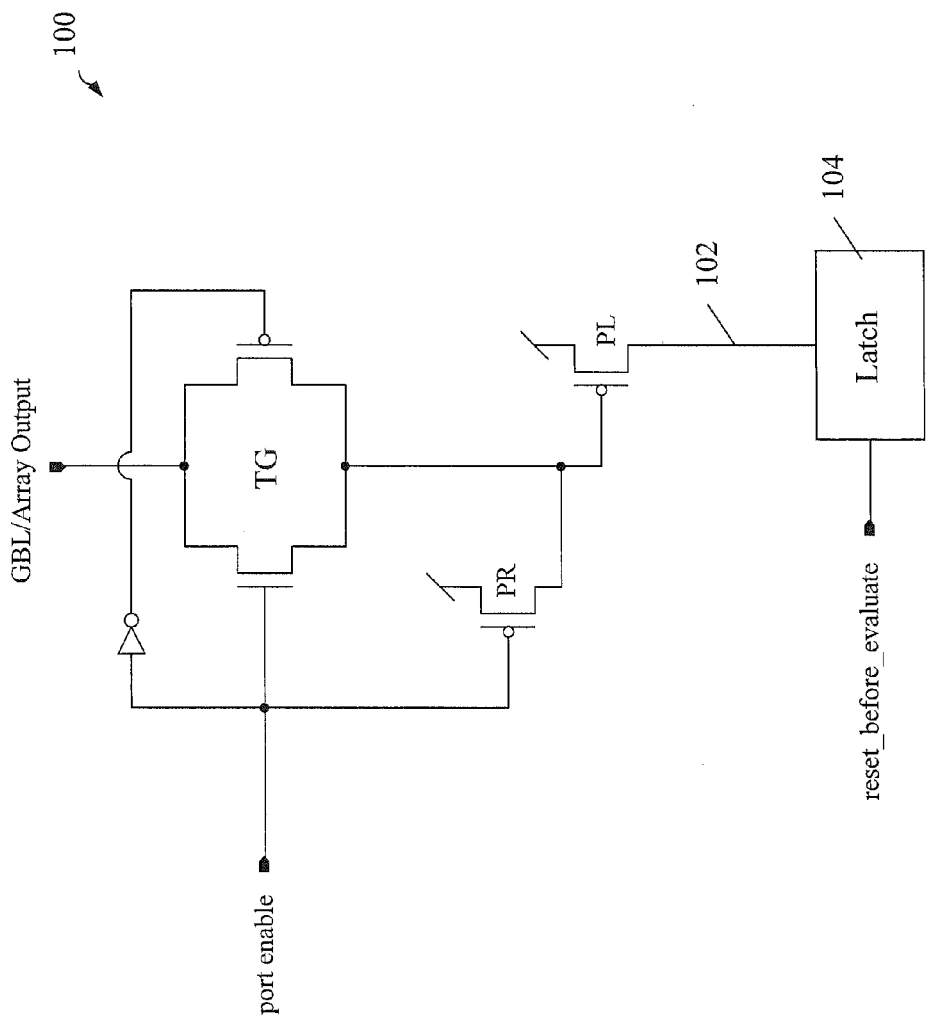
FIG. 1 is a schematic diagram of a memory array output control circuit employing a port enable signal generated in accordance with an embodiment of the invention.

Referring initially to FIG. 1, there is shown a schematic diagram of a memory array output control circuit 100 employing a port enable signal generated in accordance with an embodiment of the invention. As is shown, the output control circuit includes a transmission gate TG, comprising parallel connected NFET (n-type field effect transistor) and PFET (p-type field effect transistor) devices, that selectively couples a global bit line (GBL) array output to one or more pull up PFET transistors PL. In the simplified schematic of FIG. 1, pull up PFET PL is coupled to an output node 102 and output (jam) latch 104. The jam latch holds data from a prior cycle, until such time as the output latch 104 is reset or precharged to a logic low (0) state by the reset_before_evaluate signal, in accordance with p-type domino circuit topology. It will be appreciated, however, that the principles herein are equally applicable to n-type domino circuit topology.

At the beginning of the cycle, when the port enable signal is deactivated (low), the transmission gate TG is off, which isolates the GBL/array output from the output circuit. In addition, a restore PFET PR precharges the gate of the pull up PFET PL high, preventing it from conducting and charging the output node 102. During this time, the reset_before_evaluate signal pulses high to reset the output latch 104 to a logic low (0) state. Once the programmable port enable signal fires (high) the transmission gate TG is conductive, and the array data is sampled and written into the latch 104. In the case where the array data is logic 1 (opposite that of the logic 0), a pull down device (not shown in FIG. 1) pulls down the voltage on the GBL/array output, in turn activating PL, and charging output node 102 high and writing a logic 1 into the latch 104. Conversely, when the array data is logic 0, the voltage on the GBL/array output remains high so as not to activate PL, and the output latch 104 retains its reset (logic 0) state.

Again, it will be appreciated that the memory array output control circuit 100 of FIG. 1 is a simplified example of such a device to illustrate how a port enable signal is used in this context. For example, where redundancy is utilized, the array output circuit 100 may also include another transmission gate in parallel to TG to provide steering capability.

Figure 2:
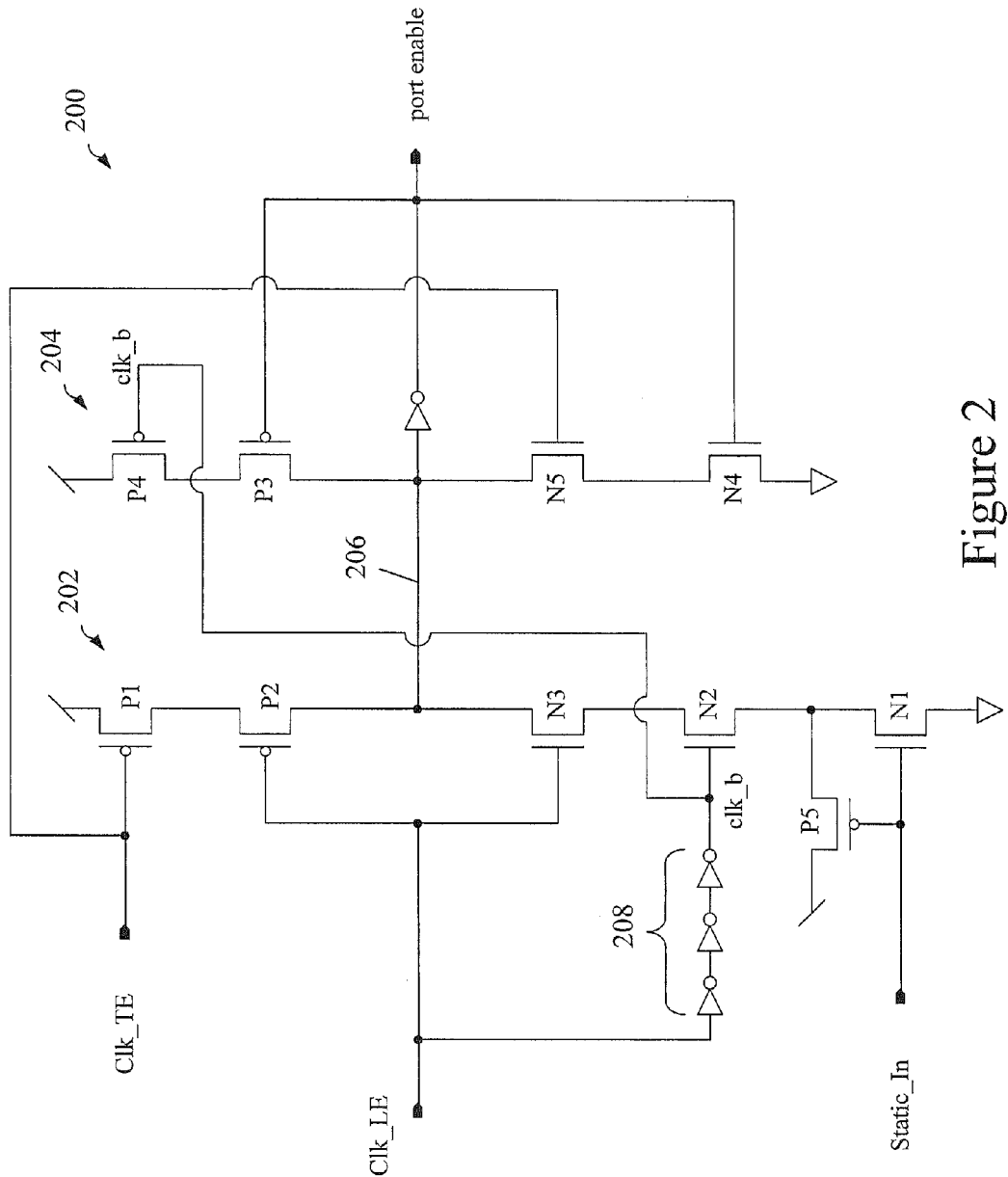
FIG. 2 is a schematic diagram of a circuit for generating the dynamic port enable signal of FIG. 1 with individually controllable rising and falling edges.

Referring now to FIG. 2, there is shown a schematic diagram of a circuit 200 for generating the dynamic port enable signal of FIG. 1 with individually controllable rising and falling edges, in accordance with a further embodiment of the invention. In essence, the port enable signal is generated by ANDing logical derivations of a dynamic clock signal (which activates high during a read) with a static input signal, Static_In (i.e., a byte enable signal). Here, the logical derivations of the dynamic clock signal are represented as Clk_LE (a programmed leading edge clock signal) and Clk_TE (a programmed trailing edge clock signal). The dynamic clock signal is generated using dummy predecoders in order to provide better tracking with the word line predecoder path.

The dynamic port enable signal generation circuit 200 includes a first dynamic transistor stack 202 and a second dynamic transistor stack 204. At the beginning of the cycle, the dynamic clock (and hence Clk_LE and Clk_TE) is low, thus PFETs P1 and P2 in the first stack 202 maintain an intermediate dynamic node 206 at logic high. The port enable signal, being the inverted value of the intermediate dynamic node 206, is also low. When the dynamic clock goes high, both Clk_LE and Clk_TE go high, and the Static_In data is sampled. If Static_In is also high, the intermediate dynamic node 206 falls through conductive NFETs N1, N2 and N3 in the first stack 202, causing the port enable signal to rise. In the case of N2, it will be noted that the gate input (clk_b) thereto is the output of an odd numbered inverter delay stage 208. While clk_b is the logical opposite of Clk_LE, the delay stage 208 does not instantaneously change from 1 to 0 when Clk_LE goes high.

As a result, the signal clk_b acts as a chopping signal effectively shutting off the evaluate stack (i.e., first stack 202) before Clk_LE falls. This allows the hold time of Static_In to be set to clk_b fall instead of Clk_LE fall. In other words, the chopper device, N2, effectively shortens the hold time of Static_In. Then, at the end of the cycle, when the dynamic clock falls, Clk_LE will fall first, followed by Clk_TE. Because the Clk_LE and Clk_TE PFETs (P1 and P2) are stacked, the later of the two falling edges (i.e., Clk_TE) ultimately controls the falling edge of the port enable signal. Thus, it will be seen that since the rising edge of Clk_LE controls the rising edge of the port enable signal, while the falling edge of Clk_TE controls the falling edge of the port enable signal, then the port enable signal is now programmable on both edges. Furthermore, since the leading edge and the falling edge of the dynamic clock signal are used to generate the port enable signal, it is able to track with the word line across various corners.

In order to prevent collisions and to hold a logic state on the intermediate dynamic node 206, the second dynamic transistor stack 204 includes a plurality of gated NFET and PFET devices. For example, keeper NFET N4 and PFET P3 are gated by the port enable signal, keeper NFET N5 is gated by Clk_TE, and keeper PFET P4 is gated by clk_b. In addition, another PFET P5 is coupled to Static_In to reduce the effects of charge sharing on the dynamic node 206, in the event where Clk_LE and clk_b are both high, but Static_In stays low.

Another consideration of the above described port enable generation circuit is to skew the inverter delay stage 208 towards the rising edge of clk_b so that the clk_b rise does not gate the next cycle's port enable rise. For example, if the duty cycle of Clk_LE is relatively high (e.g., high for 80 picoseconds (ps) and low for only 10 ps before going back high again), the port enable should fire in back to back cycles, assuming Static_In is high. When the current cycle's Clk_LE falls, it triggers clk_b to rise, setting up to the next cycle's Clk_LE rise; thus, if the Clk_LE fall to Clk_b rise delay is too long (e.g., 20 ps), then the port enable rise in the second cycle would be triggered by a late clk_b rise, instead of the Clk_LE rise as desired. In other words, the inverter delay stage 208 is set such that the chopper path is reset in time for the next cycle's Clk_LE.

In addition, Static_In is setup to Clk_LE. The presence of the chopper device means only that the hold time (not the setup time) of Static_In is set to clk_b. In the beginning of a cycle, Clk_LE=0, and clk_b=1. Assuming for example that in a previous cycle, Static_In is set to 1, and then the port enable fired in the previous cycle. Assuming further that is not desired for port enable to fire in the current cycle, then Static_In has to be set to 0. However, if the Static_In low signal comes in after Clk_LE rises, the domino stack will pull down and cause a false port enable to fire. Accordingly, Static_In is set up to Clk_LE and is set before Clk_LE rises.

Figure 3:
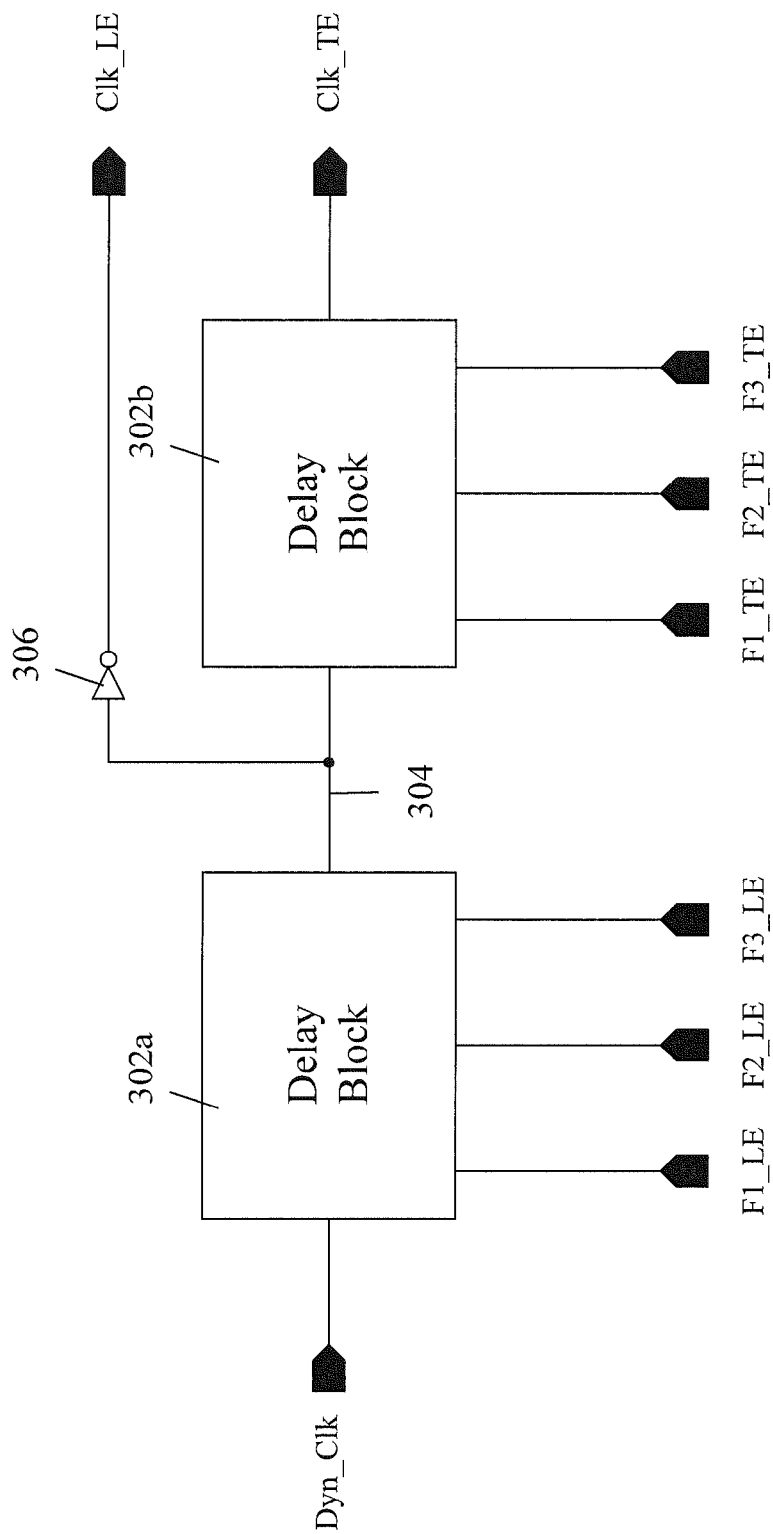
FIG. 3 is a schematic diagram of a pair of delay blocks for generating both programmable rising and falling edge clock signals used as inputs to the circuit of FIG. 2.

FIG. 3 is a schematic diagram of a pair of delay blocks 302a, 302b for generating both programmable rising and falling edge clock signals (Clk_LE, Clk_TE) used as inputs to the circuit 200 of FIG. 2. As is shown, a first delay block 302a receives the dynamic clock signal (Dyn_Clk), as well as a first set of programmable bits (F1_LE, F2_LE, F3_LE) as inputs thereto. The first set of programmable bits may originate from, for example scan latches. Depending upon the values of this first set of bits, the pull down strength of an inverter included in the first delay block 302a is altered, thus resulting in a programmable falling edge of an intermediate output signal 304. In order to create, therefore, a programmable leading edge clock signal derivation of the dynamic clock signal Dyn_Clk, the intermediate output signal 304 is inverted with inverter 306, thereby resulting in Clk_LE. As will be illustrated in further detail below, where the F1_LE, F2_LE, F3_LE inputs are all high, the first programmable delay block 302 and inverter 306 generates a faster rising edge for Clk_LE. Where the F1_LE, F2_LE, F3_LE inputs are all low, the first programmable delay block 302 and inverter 306 generates a slower rising edge for Clk_LE, with programmable values in between the two extremes.

As further illustrated in FIG. 3, the intermediate output signal 304 is also coupled to a second delay block 302b, which operates similar to the first delay block 302a. Since the second delay block 302b is another inverter stage, its output (Clk_TE) is logically equivalent to Dyn_Clk, and acts as a programmable falling edge derivative of the dynamic clock. More significantly, it will be noted that the second delay block 302b has a second set of programmable bits (F1_TE, F2_TE, F3_TE) as inputs thereto, which are independent from the first set of programmable bits. Similar to the rising edge signal, where if the F1_TE, F2_TE, F3_TE inputs are all high, the falling edge of Clk_TE occurs sooner, and where if the F1_TE, F2_TE, F3_TE inputs are all low, the falling edge of Clk_TE occurs later.

Figure 4:
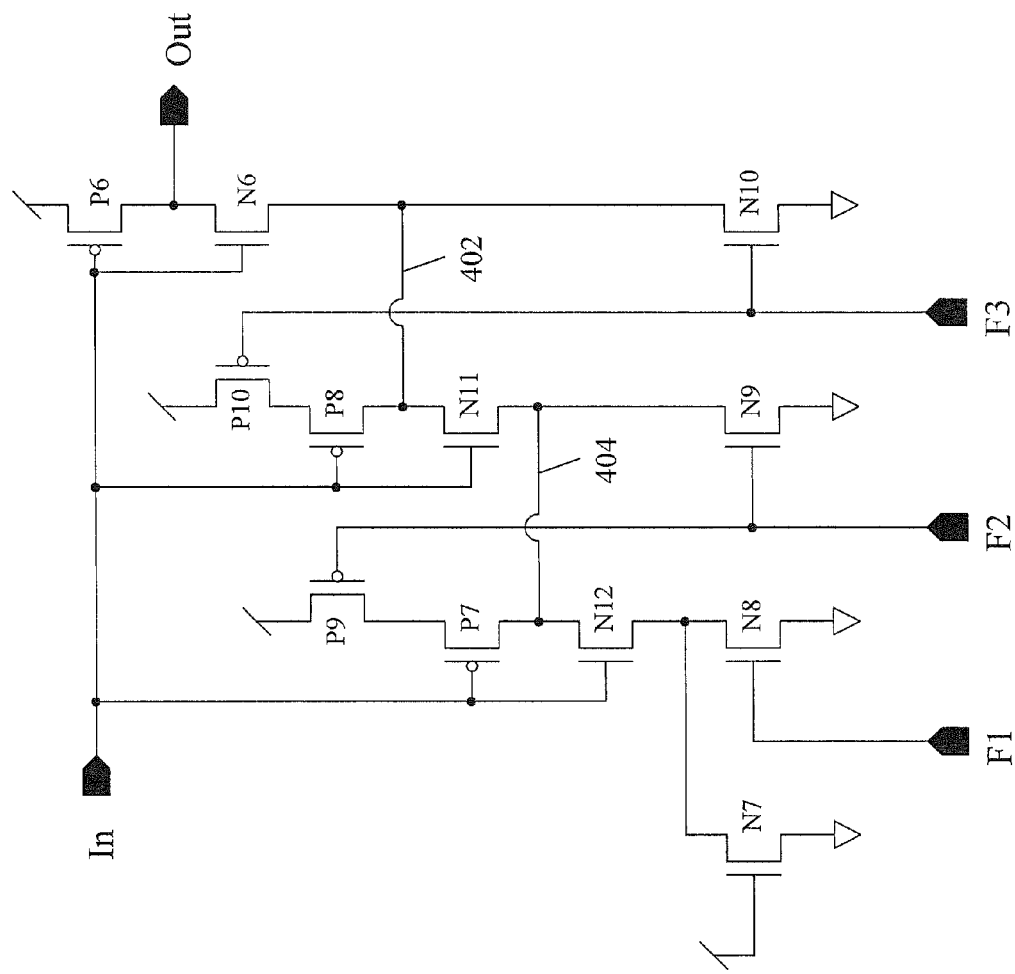
FIG. 4 is a schematic diagram illustrating the operation of the delay blocks in further detail.

FIG. 4 is a schematic diagram illustrating the operation of the delay blocks 302a, 302b in further detail. The delay block receives an input signal (In) and produces an inverted output signal (Out). As can be seen, since there are no devices coupled between PFET P6 and the logic high power supply rail, the state of the programmable bits F1, F2 and F3 do not affect the pull up time (i.e., the rising edge) of the output signal. However, located between NFET N6 and the logic low power supply rail, the delay block includes a plurality of footer NFET devices (N7, N8, N9 and N10). NFET N7 is arranged in an always on state, while the gates of N8, N9 and N10 are respectively controlled by the programmable bits F1, F2 and F3. Thus, in the scenario where F1, F2 and F3 are all 0, the programmed falling edge of the output signal is the slowest, as the output has to discharge through internal nodes 402 and 404, via the series combination of N6, N11, N12 and N7. N11 and N12 are also respectively in series with N9 and N10, and are gated by the input signal to the delay block.

Also included in the delay block are PFETs P7 and P8, which prevent keeper PFETS P9 and P10, respectively, from opposing the discharge of internal nodes 402 and 404 during a rising input signal where F2 and F3 are programmed to 0. In the slow scenario (F2 and F3=0), P9 and P10 maintain the internal nodes at logic high when the input signal is so as to allow for a slower discharge of the output when the input signal transitions high.

In the scenario where F1, F2 and F3 are all 1, parallel discharge paths are created for the output node, thus the programmed falling edge of the output signal is the fastest.

Figure 5:
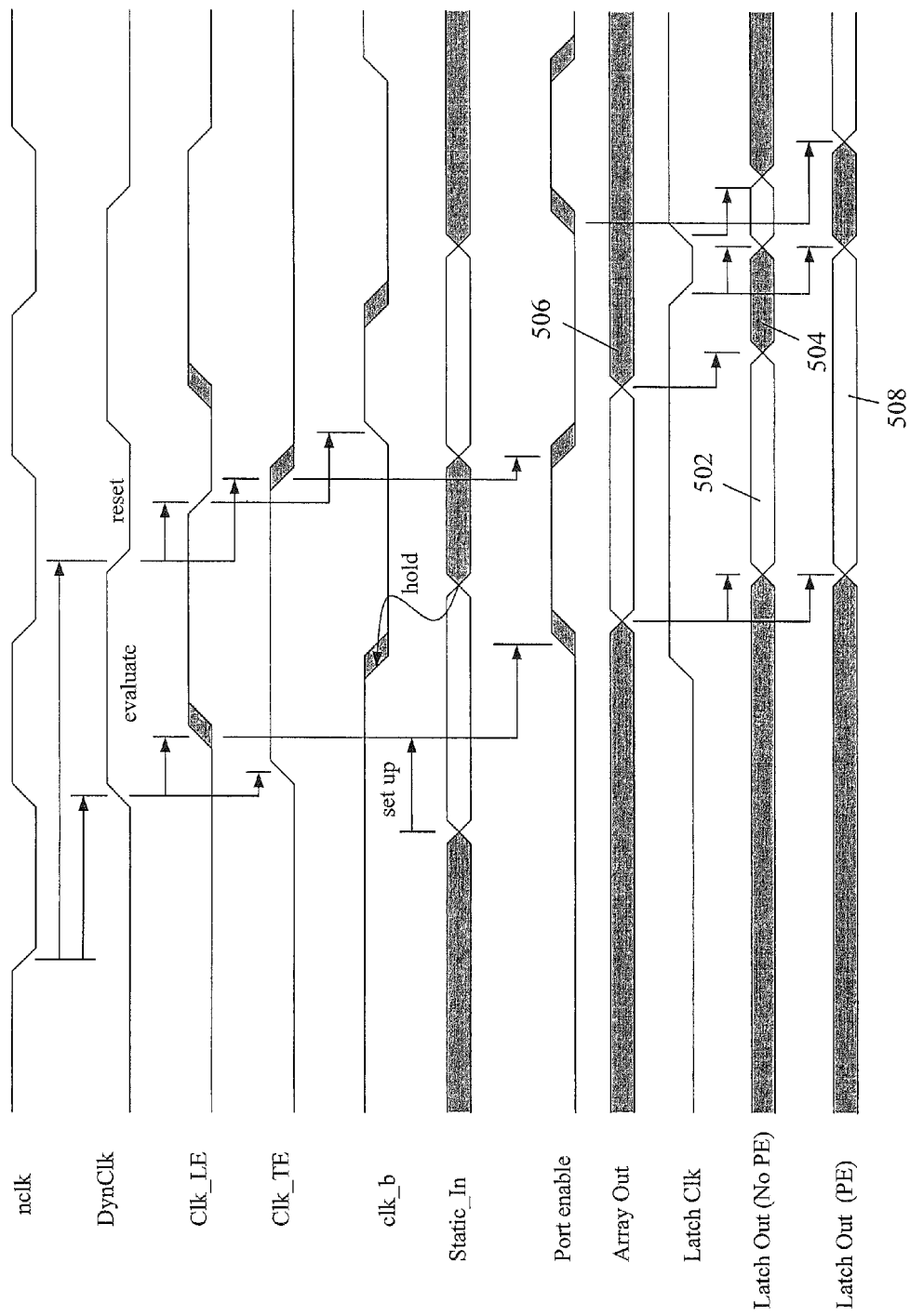
FIG. 5 is a timing diagram illustrating the operation of the memory array output circuit with the programmable port enable signal.

Finally, FIG. 5 is a timing diagram illustrating the operation of the memory array output circuit with the dual programmable edge port enable signal. As described above, both edges of port enable signal are programmable, as reflected by the shaded regions at the rising and falling edges of the signal. In addition, the hold time of Static_In input is determined by the falling edge of clk_b rather than the falling edge of Clk_LE, resulting in a shorter hold time. A comparison between the memory latch output, both with and without the generated port enable signal is also demonstrated in FIG. 5.

Without such a port enable signal, the current cycle latched output data 502, Latch Out (No PE), is corrupted at 504 by early arriving Array Out data 506 since this data is not gated. In contrast, with the presence of the port enable signal as generated herein, the same early arriving Array Out data 506 does not corrupt the current cycle latched output data 508, Latch Out (PE) due to the inactive port enable signal at that time.

It will be noted that if the rising edge of Port Enable is after the rising edge of the array output (506 of FIG. 5), it will gate the data launch out of the array. Since the leading edge of port enable can set the time when the data is launched out of the array and it also affects the evaluate time of the dynamic node (102 of FIG. 1), it is desirable to have the leading edge be programmable. Since the trailing edge of port enable is used to block the next cycle's fast read or write through data from corrupting the latched result of the current cycle and it also affects the evaluate time of the dynamic node (102 of FIG. 1), it is desirable to have the trailing edge be programmable.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of generating a dynamic port enable signal for gating memory array data to an output node, the method comprising:

generating a programmable leading edge clock signal derivation of an input dynamic clock signal;

generating a programmable trailing edge clock signal derivation of the input dynamic clock signal, wherein the leading edge clock signal derivation and the trailing edge clock signal derivation are independently programmable with respect to one another;

gating the generated programmable leading and trailing edge clock signal derivations with a static input enable signal so as to generate the port enable signal such that, when inactive, the port enable signal prevents early memory array data from being coupled to the output node; and chopping the leading edge clock signal derivation with a delayed, inverted version thereof such that only a set up time of the static input enable signal is coincident with the leading edge clock signal derivation, and a hold time of the static input enable signal is coincident with the delayed, inverted version of the leading edge clock signal derivation.

2. The method of claim 1, wherein a leading edge of the port enable signal is controlled by the leading edge clock signal derivation and a trailing edge of the port enable signal is controlled by the trailing edge clock signal derivation.

3. The method of claim 1, further comprising coupling the input dynamic clock signal to a first delay block having a first set of programmable bits input thereto to generate the leading edge clock signal derivation, and coupling an output of the first delay block to a second delay block to generate the trailing edge clock signal derivation, the second delay block having a second set of programmable bits input thereto.

4. The method of claim 3, wherein the leading edge clock signal derivation is an inverted version of the output of the first delay block.

5. The method of claim 4, wherein the first and second delay blocks comprise an inverter having a programmable pull down strength, as respectively determined by the first and second sets of programmable bits.

6. A circuit for generating a dynamic port enable signal for gating memory array data to an output node, comprising:
   a first dynamic transistor stack, the first dynamic transistor stack having a programmable leading edge clock signal derivation of an input dynamic clock signal, a programmable trailing edge clock signal derivation of the input dynamic clock signal, and a static input enable signal as inputs thereto, wherein the leading edge clock signal derivation and the trailing edge clock signal derivation are independently programmable with respect to one another;
   the first dynamic transistor stack having an intermediate output node, an inverted value of which defines the dynamic port enable signal, with the dynamic port enable signal being generated by the leading edge clock signal derivation, the trailing edge clock signal derivation and the static input enable signal;
   wherein the port enable signal, when inactive, prevents early memory array data from being coupled to the output node; and
   a chopper device that chops the leading edge clock signal derivation with a delayed, inverted version thereof such that only a set up time of the static input enable signal is coincident with the leading edge clock signal derivation, and a hold time of the static input enable signal is coincident with the delayed, inverted version of the leading edge clock signal derivation.

7. The circuit of claim 6, wherein a leading edge of the port enable signal is controlled by the leading edge clock signal derivation and a trailing edge of the port enable signal is controlled by the trailing edge clock signal derivation.

8. The circuit of claim 6, further comprising:
   a first delay block having the input dynamic clock signal and a first set of programmable bits as inputs thereto to generate the leading edge clock signal derivation; and
   a second delay block having an output of the first delay block and a second set of programmable bits as inputs thereto to generate the trailing edge clock signal derivation.

9. The circuit of claim 8, wherein the leading edge clock signal derivation is an inverted version of the output of the first delay block.

10. The circuit of claim 9, wherein the first and second delay blocks comprise an inverter having a programmable pull down strength, as respectively determined by the first and second sets of programmable bits.

11. The circuit of claim 6, wherein the chopper device comprises an odd numbered inverter stage having an output coupled to a pull down transistor in the first dynamic transistor stack.

12. The circuit of claim 11, wherein the output of the chopper device is further coupled to an input of second dynamic transistor stack configured to prevent signal collisions between the leading and trailing edge clock signal derivations on the intermediate output node.

13. A memory array output control circuit, comprising:
   a transmission gate that selectively couples an array output bit line to an output latch, the transmission gate controlled by a dynamically generated port enable signal;
   a port enable generation circuit that generates the port enable signal, the port enable generation circuit comprising a first dynamic transistor stack, the first dynamic transistor stack having a programmable leading edge clock signal derivation of an input dynamic clock signal, a programmable trailing edge clock signal derivation of the input dynamic clock signal, and a static input enable signal as inputs thereto, wherein the leading edge clock signal derivation and the trailing edge clock signal derivation are independently programmable with respect to one another;
   the first dynamic transistor stack having an intermediate output node, an inverted value of which defines the port enable signal, with the port enable signal being generated by the leading edge clock signal derivation, the trailing edge clock signal derivation and the static input enable signal;
   wherein the port enable signal, when inactive, prevents early memory array data from the array output bit line from being captured at the output latch; and
   a chopper device that chops the leading edge clock signal derivation with a delayed, inverted version thereof such that only a set up time of the static input enable signal is coincident with the leading edge clock signal derivation, and a hold time of the static input enable signal is coincident with the delayed, inverted version of the leading edge clock signal derivation.

14. The circuit of claim 13, wherein a leading edge of the port enable signal is controlled by the leading edge clock signal derivation and a trailing edge of the port enable signal is controlled by the trailing edge clock signal derivation.

15. The memory array output control circuit of claim 13, further comprising:
   a first delay block having the input dynamic clock signal and a first set of programmable bits as inputs thereto to generate the leading edge clock signal derivation; and
   a second delay block having an output of the first delay block and a second set of programmable bits as inputs thereto to generate the trailing edge clock signal derivation.

16. The memory array output control circuit of claim 15, wherein the leading edge clock signal derivation is an inverted version of the output of the first delay block.

17. The memory array output control circuit of claim 16, wherein the first and second delay blocks comprise an inverter having a programmable pull down strength, as respectively determined by the first and second sets of programmable bits.

18. The memory array output control circuit of claim 13, wherein the chopper device comprises an odd numbered inverter stage having an output coupled to a pull down transistor in the first dynamic transistor stack.

19. The memory array output control circuit of claim 18, wherein the output of the chopper device is further coupled to an input of second dynamic transistor stack configured to prevent signal collisions between the leading and trailing edge clock signal derivations on the intermediate output node.

* * * * *